United States Patent
Chun (10) Patent No.: US 7,876,617 B2
(45) Date of Patent: Jan. 25, 2011

(54) APPARATUS AND METHOD FOR PROVIDING POWER IN SEMICONDUCTOR MEMORY DEVICE

(75) Inventor: Jun-Hyun Chun, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 184 days.

(21) Appl. No.: 12/325,364

(22) Filed: Dec. 1, 2008

(65) Prior Publication Data

US 2010/0054050 A1    Mar. 4, 2010

(30) Foreign Application Priority Data

Sep. 3, 2008    (KR) .................... 10-2008-0086824

(51) Int. Cl.
*G11C 16/04*    (2006.01)
(52) U.S. Cl. ............................. 365/185.11; 365/230.03
(58) Field of Classification Search ............ 365/185.11, 365/230.03, 222, 185.23, 230.06, 189.08
See application file for complete search history.

(56) References Cited

U.S. PATENT DOCUMENTS

| | | | |
|---|---|---|---|
| 7,277,352 B2 | 10/2007 | Raad | |
| 2006/0087898 A1* | 4/2006 | Xi et al. ................ | 365/189.09 |

FOREIGN PATENT DOCUMENTS

| | | |
|---|---|---|
| JP | 06-103749 | 4/1994 |
| KR | 1020010004222 A | 1/2001 |
| KR | 1020070099958 A | 10/2007 |

OTHER PUBLICATIONS

Notice of Allowance issued from Korean Intellectual Property Office on Mar. 30, 2010.
Notice of Preliminary Rejection issued from Korean Intellectual Property Office on Jan. 28, 2010.

* cited by examiner

*Primary Examiner*—Huan Hoang
*Assistant Examiner*—Jason Lappas
(74) *Attorney, Agent, or Firm*—IP & T Group LLP (57) ABSTRACT

An apparatus for applying power in a semiconductor memory device includes a first power pin for receiving a first power at a first voltage from an external device, a second power pin for receiving a second power at the first voltage, a memory array block connected to the first power pin, the memory array block writing input data, outputting read data, and refreshing regularly to sustain stored data, a peripheral logic block connected to the first power pin for receiving the first power and communicating with the memory array block to perform data write and read operations, a data output driver connected to the second power pin and driving a data output pin, and a switch for electrically connecting the first power pin and the second power pin by performing a switching operation during a refresh operation of the memory array block.

14 Claims, 6 Drawing Sheets

| | 1 | 2 | 3 | 4 | 5 | 6 | 7 | 8 | 9 | 10 | 11 | |
|---|---|---|---|---|---|---|---|---|---|---|---|---|
| A | NC | NC | | NC | | | | NC | | NC | NC | |
| B | | | | | | | | | | | | |
| C | | | | | | | | | | | | |
| D | NC | VDDQ | DQU5 | DQU7 | | | | DQU4 | VDDQ | VSS | NC | A |
| E | | VSSQ | VDD | VSS | | | | DQSU# | DQU6 | VSSQ | | B |
| F | | VDDQ | DQU3 | DQU1 | | | | DQSU | DQU2 | VDDQ | | C |
| G | | VSSQ | VDDQ | DMU | | | | DQU0 | VSSQ | VDD | | D |
| H | | VSS | VSSQ | DQL0 | | | | DML | VSSQ | VDDQ | | E |
| J | | VDDQ | DQL2 | DQSL | | | | DQL1 | DQL3 | VSSQ | | F |
| K | | VSSQ | DQL6 | DQSL# | | | | VDD | VSS | VSSQ | | G |
| L | | VREFDQ | VDDQ | DQL4 | | | | DQL7 | DQL5 | VDDQ | | H |
| M | | NC | VSS | RAS# | | | | CK | VSS | NC | | J |
| N | | ODT | VDD | CAS# | | | | CK# | VDD | CKE | | K |
| P | | NC | CS# | WE# | | | | A10/AP | ZQ | NC | | L |
| R | | VSS | BA0 | BA2 | | | | A15 | VREFCA | VSS | | M |
| T | | VDD | A3 | A0 | | | | A12 | BA1 | VDD | | N |
| U | | VSS | A5 | A2 | | | | A1 | A4 | VSS | | P |
| V | | VDD | A7 | A9 | | | | A11 | A6 | VDD | | R |
| W | NC | VSS | RESET# | A13 | | | | A14 | A8 | VSS | NC | T |
| Y | | | | | | | | | | | | |
| AA | NC | NC | | NC | | | | NC | | NC | NC | |
| AB | | | 1 | 2 | 3 | 4 | 5 | 6 | 7 | 8 | 9 | |

Note1: NC balls indicate mechanical support with no internal connection. Any of the support ball locations may or may not be populated with a ball.

MO − 207 Variation DU-z (x16)

MO − 207 Variation TBD (x16) with support balls

○ Populated ball
+ Ball not populated

APPARATUS AND METHOD FOR PROVIDING POWER IN SEMICONDUCTOR MEMORY DEVICE

CROSS-REFERENCE TO RELATED APPLICATION

The invention claims priority of Korean patent application number 10-2008-0086824, filed on Sep. 3, 2008, which is incorporated by reference in its entirety.

BACKGROUND OF THE INVENTION

The invention relates to a semiconductor memory device, and more particularly, to an apparatus and method for applying power to a semiconductor memory device.

In general, a semiconductor memory device such as a dynamic random access memory (DRAM) includes a core region for processing data and a data input/output region for exchanging data with another semiconductor device. The data input/output region includes a data input buffer and a data output circuit. The core region also includes a memory array block and a peripheral logic block.

Figure 1:
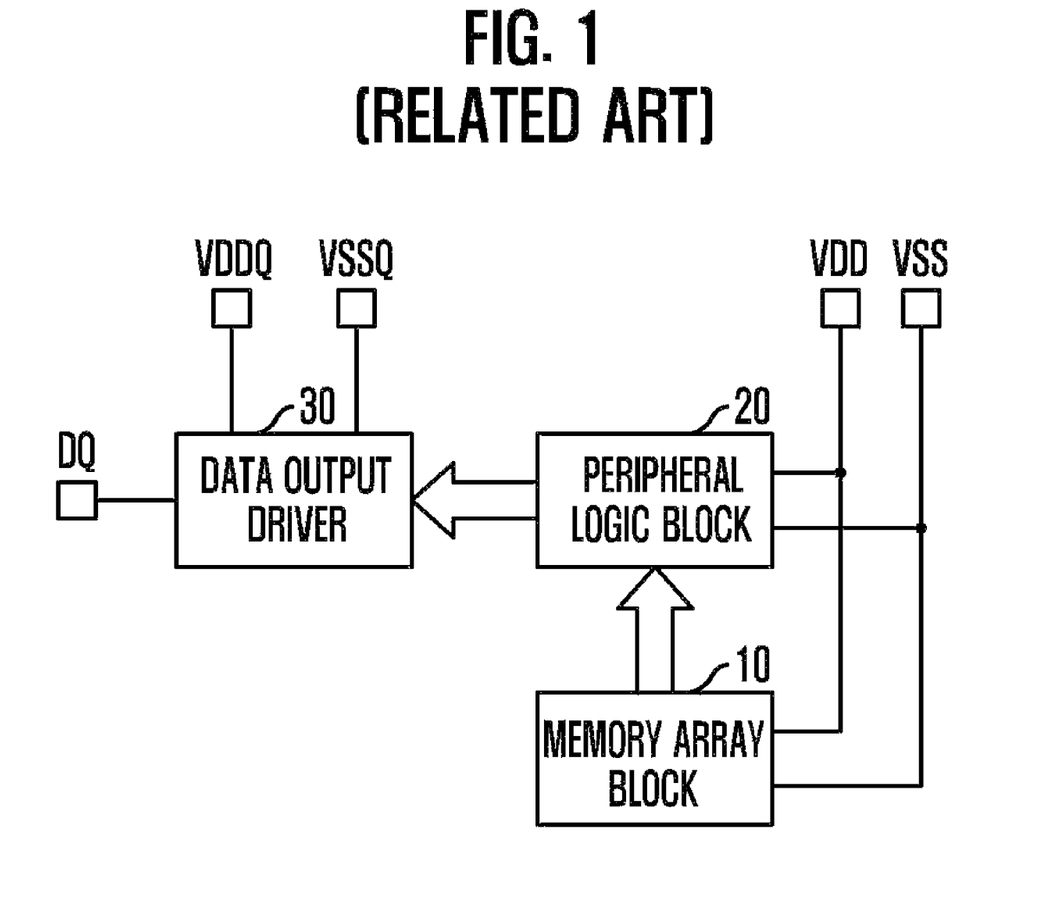
FIG. 1 is a block diagram illustrating a semiconductor memory device according to the related art.

As shown in FIG. 1, the semiconductor memory device such as the DRAM is applied with two types of power VDD/VSS and VDDQ/VSSQ. The VDD power and the VSS power are applied to a memory array block 10 and a peripheral logic block 20, and the VDDQ power and the VSSQ power are applied to a data output driver 30 for outputting data. Except the data output driver 30, all other parts use the VDD power. The VDD power is also used to generate various voltage levels of internal power for effectively performing write and read operations in the DRAM. The VDD power and the VDDQ power are the same level power that is directly applied from the outside of the semiconductor memory device. The VDD power and the VDDQ power are physically separated not only in the outside but also in the inside of the semiconductor memory device.

Figure 2:
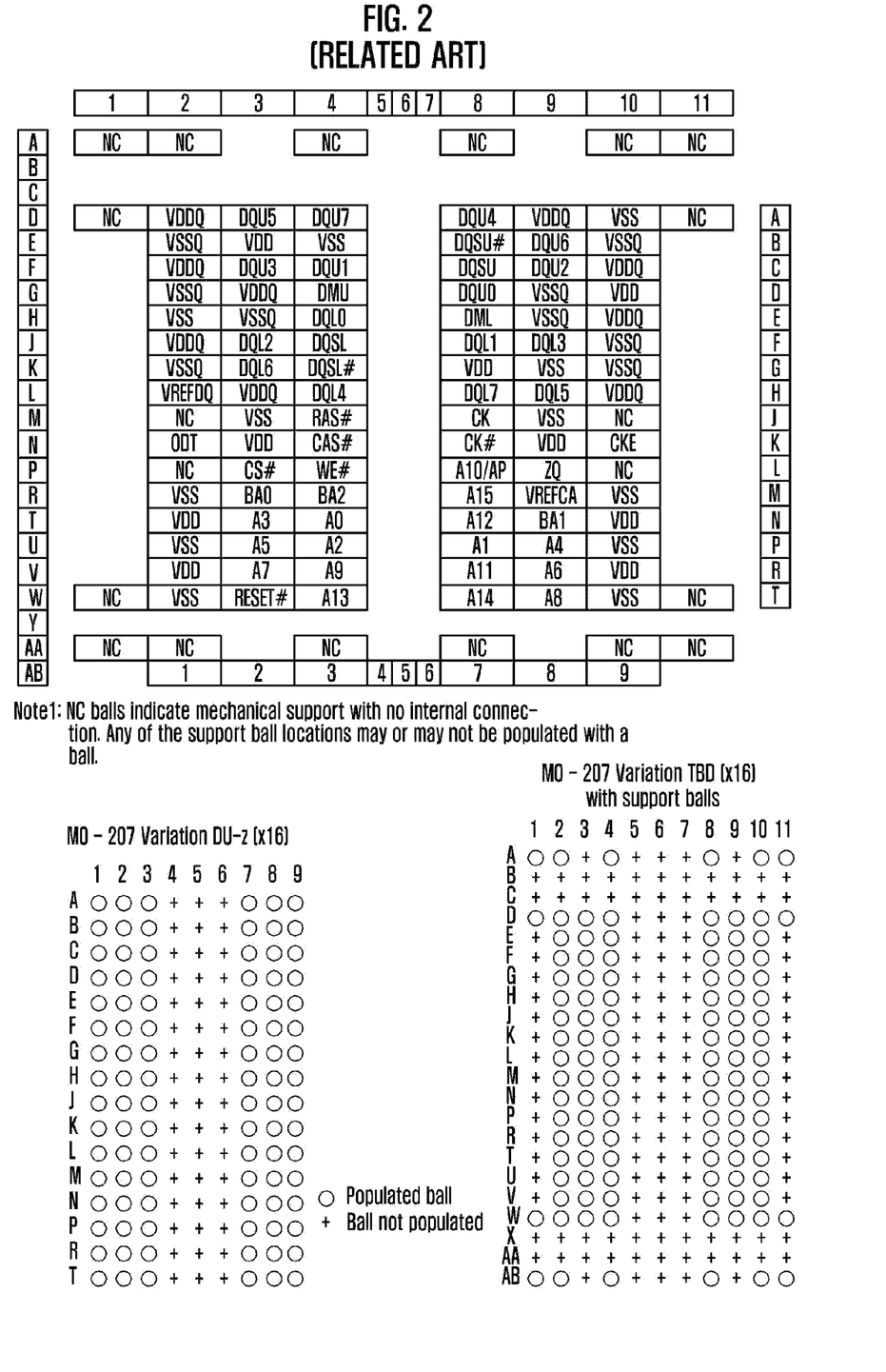
FIG. 2 is a diagram illustrating a JEDEC standard pin-out structure of a DDR3 SDRAM package.

Meanwhile, a pin-out structure of a DDR3 SDRAM package is divided into a data input/output block and an address block according to the specification of JEDEC standard, as shown in FIG. 2. Herein, DDR3 SDRAM denotes a Double Data Rate 3 Synchronous Dynamic Random Access Memory, and JEDEC denotes Joint Electron Device Engineering Council. The data input/output block includes DQ pins such as DQSU#, DQU6, DQSU, DQU2, and DQL3 for inputting and outputting data. The address block includes address pins A0 to A15, clock pins such as CK and CK#, and command input pins such as CAS#, RAS#, CS#, and WE#. Since the address block includes many VDD power pins and VSS power pins, it is easy to apply the VDD power and the VSS power. On the contrary, it is difficult to additionally dispose VDD power pins and VSS power pins in the data input/output block because the data input/output block VDDQ already includes many VDD and VSS power pins.

Figure 3:
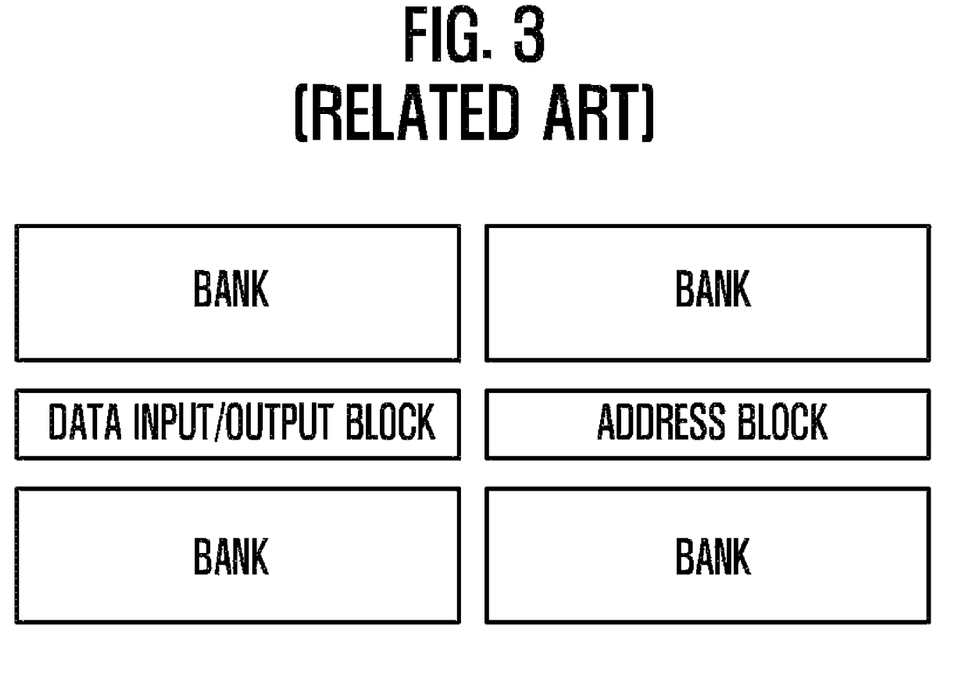
FIG. 3 is a diagram illustrating blocks disposed in a DRAM chip.

Such a pin-out structure of the DDR3 SDRAM package is badly designed to apply power for predetermined operation modes of a semiconductor memory device. For example, the VDD power having a dropped voltage level is applied to a memory array block 10 and a peripheral logic block 20 of a memory bank that is adjacent to a data input/output block as shown in FIGS. 1 and 3 in an operation mode that consumes a large amount of instantaneous current, such as a refresh operation mode, particularly, an auto refresh operation mode. As a result, the operations of the memory array block 10 and the peripheral logic block 20 are performed unstably.

SUMMARY OF THE INVENTION

Embodiments of the invention are directed to provide a power supply apparatus and method for guaranteeing stable operation in a predetermined operation mode that has a problem of applying power.

In accordance with an aspect of the invention, there is provided a power supply apparatus and method that guarantees stable operation of a memory array block and a peripheral logic block by applying a power, which is applied to a data output driver not driven in a predetermined operation mode such as a refresh mode consuming a large amount of current instantly, to the memory array block and the peripheral array block.

In accordance with another aspect of the invention, there is provided an apparatus for applying power of a semiconductor memory device, including a first power pin for receiving a first power at a first voltage from an external device, a second power pin for receiving a second power at the first voltage, a memory array block connected to the first power pin, writing input data, outputting read data, and refreshing regularly for sustaining stored data, a peripheral logic block connected to the first power pin and communicating with the memory array block to perform a data write operation and a data read operation, a data output driver connected to the second power pin and driving a data output pin for outputting data from the memory array block through the peripheral logic block, and a switch for electrically connecting the first power pin and the second power pin by performing a switching operation during a refresh operation of the memory array block.

In accordance with still another aspect of the invention, there is provided a method for applying power to a semiconductor memory device including a first power pin for receiving a first power at a first voltage from an external device, a second power pin for receiving a second power at the first voltage, a memory array block connected to the first power pin, the memory array block writing input data, outputting read data, and refreshing regularly to sustain stored data, a peripheral logic block connected to the first power pin for receiving the first power and communicating with the memory array block to perform a data write operation and a data read operation, a data output driver connected to the second power pin for receiving the second power and driving a data output pin for outputting data from the memory array block through the peripheral logic block, the method including determining whether or not a current operation is a refresh operation mode of the memory array block, and electrically connecting the first power pin with the second power pin for the refresh operation mode.

In accordance with still another aspect of the invention, there is provided an apparatus for applying a power to a semiconductor memory device, including a first power pin for receiving a first power at a first voltage from an external device, a second power pin for receiving a second power at the first voltage, a memory array block for writing input data and outputting read data, a peripheral logic block for supporting a data write operation and a data read operation of the memory array block, a data output driver for driving a data output pin for outputting data from the memory array block through the peripheral logic block, a first power bus for connecting the memory array block and the peripheral circuit to the first power pin, a second power bus for connecting the data output driver to the second power pin, and a switch for connecting the first power bus and the second power bus by performing a switching operation in an operation mode where the data output driver is not driven and a voltage level of a power applied to the first power bus is dropped.

In accordance with yet another aspect of the invention, there is provided a method for applying a power to a semiconductor device including a first power pin for receiving a first power at a first voltage from an external device, a second power pin for receiving a second power at the first voltage, a memory array block for writing input data and outputting read data, a peripheral logic block for supporting a data write operation and a data read operation of the memory array block, a data output driver for driving a data output pin for outputting data from the memory array block through the peripheral logic block, a first power bus for connecting the memory array block and the peripheral logic block to the first power pin, and a second power bus for connecting the data output driver to the second power pin, the method including determining whether a voltage level of a power applied to the first power bus is dropped and whether a current operation mode is an operation mode that the data output driver is not driven, and electrically connecting the first power bus and the second power bus if the current operation mode is the operation mode that the data output driver is not driven.

DESCRIPTION OF SPECIFIC EMBODIMENTS

Other objects and advantages of the invention can be understood by the following description, and become apparent with reference to the embodiments of the invention.

The inventors of the invention discover the difficulty of applying a power in a predetermined operation mode of a semiconductor memory device that has a pin-out structure of a DDR3 SDRAM package shown in FIG. 2. For example, a power with a dropped voltage level may be applied to a memory array block 10 and a peripheral logic block 20, which are disposed closely to a data input/output pin shown in FIGS. 1 and 3, in a predetermined operation mode that consumes a large amount of current instantly, such as a refresh mode. It causes instable operation of the memory array block 10 and the peripheral logic block 20.

Figure 5:
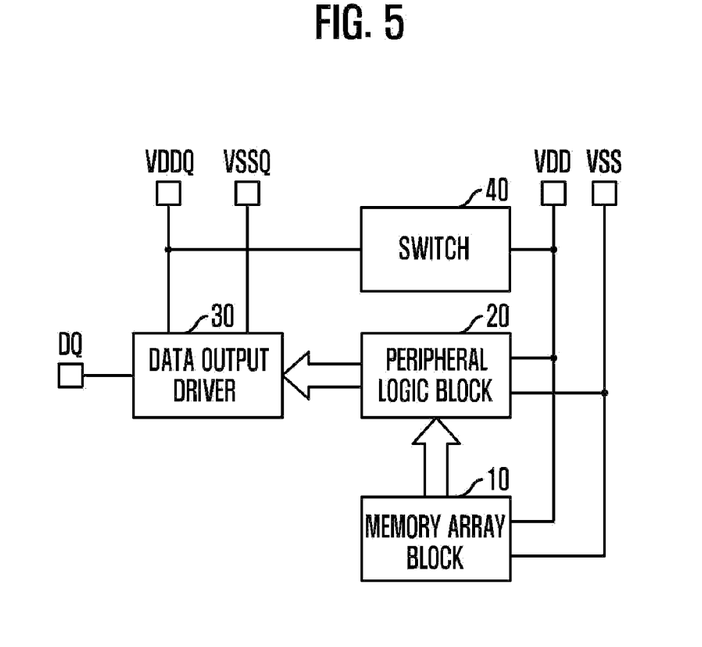
FIG. 5 is a block diagram illustrating a semiconductor memory device in accordance with an embodiment of the invention.
Figure 6:
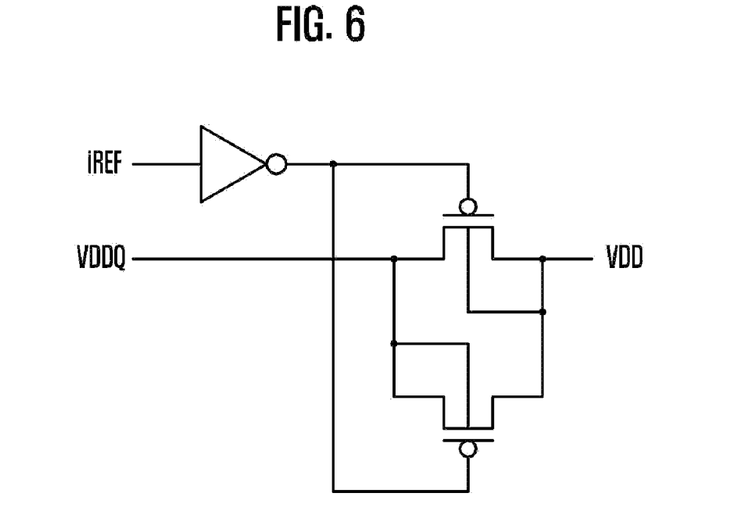
FIG. 6 is a circuit diagram illustrating a switch of FIG. 5.
Figure 7:
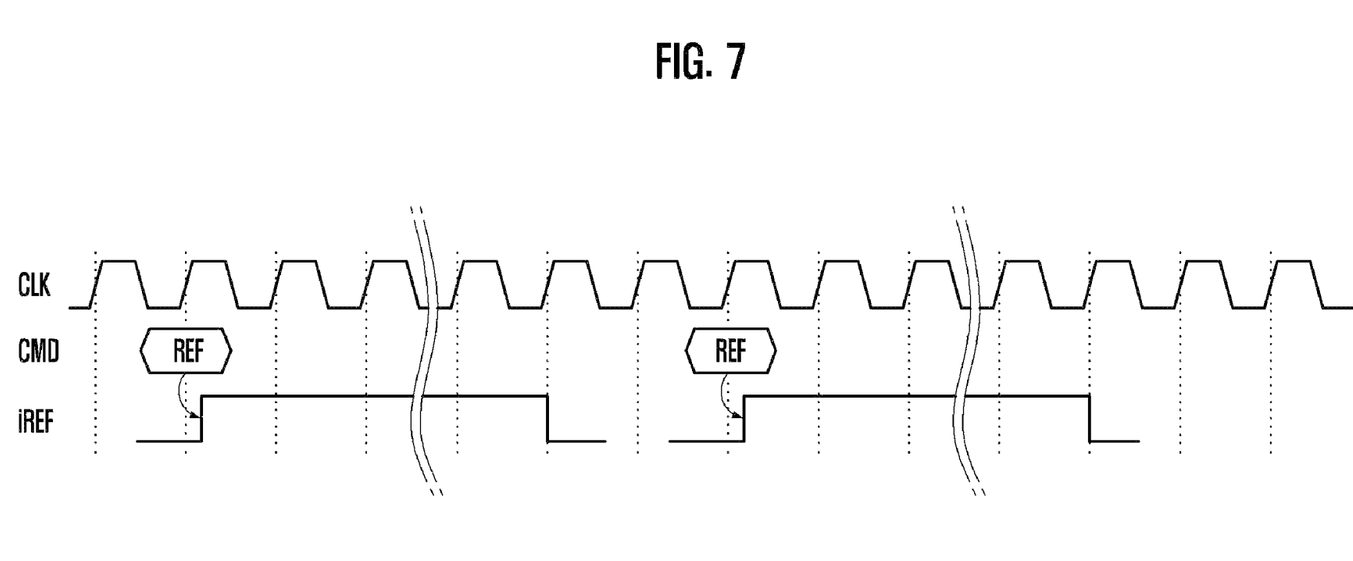
FIG. 7 is a timing diagram of a switch of FIG. 5.

FIGS. 5 to 7 show a power supply apparatus and method for overcoming such a difficulty of applying power. The power supply apparatus according to the embodiment can reduce the decrement of a VDD voltage level, which occurs in the data input/output block, by shorting the power VDD from a power VDDQ for driving a data output driver using a field effect transistor (FET) in a predetermined operation mode that consumes a large amount of current, such as a refresh operation mode. FIG. 6 shows an exemplary embodiment of the switch that connects the power VDD and the power VDDQ. However, the switch according to the invention is not limited to the switch shown in FIG. 6.

Meanwhile, the inventors of the invention discover U.S. Pat. No. 7,277,352 B2 dated Oct. 2, 2007 as the related art (hereinafter "first related art").

Figure 4:
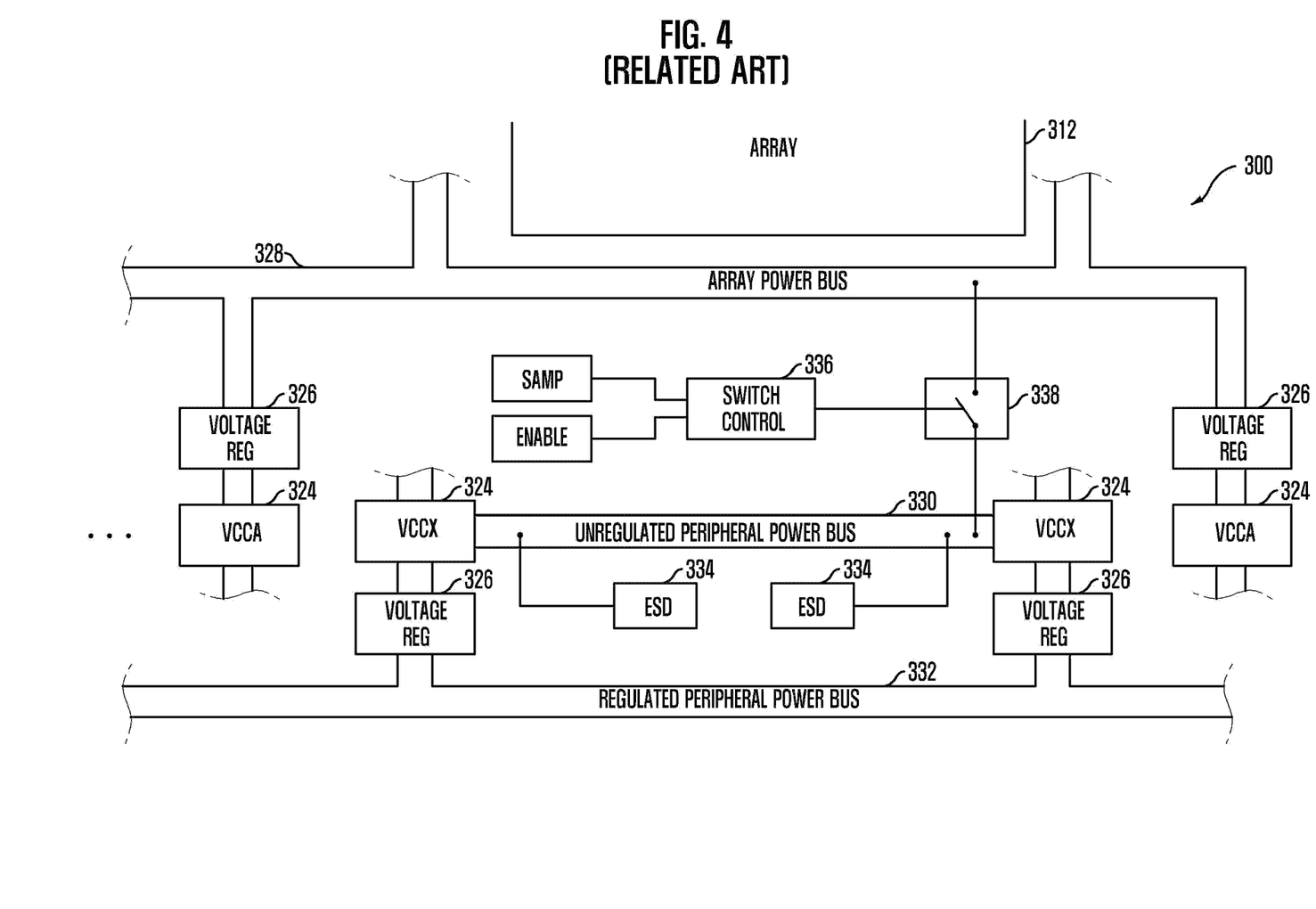
FIG. 4 shows FIG. 3 of U.S. Pat. No. 7,277,353 B2.

At first, the first related art is developed for overcoming a power supply problem between peripheral circuits such as a memory array 312 or a delay lock loop (DLL) with other synchronization control circuits as shown in FIG. 4 unlike the invention developed for overcoming a power supply problem between the memory array block 10 and the peripheral logic circuit 20.

Secondly, the first related art relates to the use of powers generated in a semiconductor memory device unlike the invention that relates to power directly applied from an external device.

Thirdly, the first related art relates to sharing two types of powers having different properties unlike the invention that relates to sharing two types of powers having the same properties. That is, the first related art relates to the uses of unregulated peripheral power VCCX and regulated array power VCCA, which are generated in the semiconductor memory device.

Fourthly, the first related art relates to sharing of two types of powers having different voltage levels unlike the invention that related to sharing of two types of powers having the same voltage level. Since the shared powers have the different voltage levels, the first related art is only driven in a limited short pulse width. If the first related art is used beside the short pulse width, it may increase the internal power for driving the memory array.

FIG. 5 is a block diagram illustrating a semiconductor memory device in accordance with an embodiment of the invention.

Referring to FIG. 5, the semiconductor memory device includes a first power pin for receiving a first power VDD from the outside and a second power pin for receiving a second power VDDQ from the outside. The semiconductor memory device includes a power pin for receiving a first ground power VSS from the outside and a power pin for receiving a second ground power VSSQ from the outside. The second power has the same voltage level of the first power. For example, in case of a DDR3 SDRAM, the first and second powers VDD and VDDQ may be 1.5±0.075 [V]. The first and second powers VDD and VDDQ are individually applied from the outside of the semiconductor memory device.

The semiconductor memory device according to the embodiment further includes a memory array block 10, a peripheral logic circuit 20, and a switch 40. The memory array block 10 is connected to the first power pin through a first power bus to receive the first power VDD and connected to a first ground power pin through a first ground power bus to receive the first ground power VSS. The memory array block 10 writes input data and outputs read data. The memory array block 10 is refreshed regularly to sustain the stored data. Such a refresh operation is performed in a refresh operation mode. The refresh operation mode is divided into a mode for performing an auto refresh operation and another mode for performing a self refresh operation.

The peripheral logic block 20 is connected to the first power pin through a first power bus to receive a first power VDD and connected to a first ground power pin through a first ground power bus to receive a first ground power VSS. The peripheral logic block 20 supports the memory array block 10 to perform the data write operation and the data read operation. The peripheral logic block 20 includes various circuits except the memory array block 10 and the data output driver 30 for supporting the memory array block 10 to perform the data write operation and the data read operation.

The data output driver 30 is connected to the second power pin through the second power bus to receive the second power VDDQ and is connected to the second ground power pin through the second ground power but to receive a second ground power VSSQ. The data output driver 30 drives a data output pin DQ for outputting data from the memory array block 10 through the peripheral logic block 20.

The switch 40 performs a switching operation if a voltage level of a power applied to the first power bus is dropped or when the data output driver 30 is not driven, thereby electrically connecting the first power bus and the second power bus. For example, the operation mode may be a refresh mode, particularly, an auto refresh mode, in which the memory array block 10 is regularly refreshed to sustain data stored in the memory array block 10. That is, the switch 40 electrically connects the first power bus and the second power but to fill up the voltage drop of the power VDD in the operation mode from the power VDDQ. For example, the switch 40 may be embodied as one inverter with two FETs as shown in FIG. 6. However, the invention is not limited thereto.

FIG. 6 is a circuit diagram illustrating a switch 40 of FIG. 5

Referring to FIG. 6, the switch 40 electrically connects the first power VDD and the second power VDDQ by performing a switching operation in response to a control signal iREF that represents a refresh operation mode of the memory array block 10. The switch 40 includes at least one of FETs. The switch 40 includes an inverter, a first FET, and a second FET. The inverter receives the control signal iREF that denotes the refresh operation mode of the memory array block 10, inverts the control signal iREF, and outputs the inverted control signal. The first FET includes a first terminal (drain) for receiving the second power VDDQ and a first control terminal (first gate) for receiving and inverting the output of the inverter, a second terminal (source) for receiving a first power VDD, and a second control terminal (second gate). The second FET includes a first terminal (drain) for receiving a first power VDD, a first control terminal (first gate) for receiving and inverting the output of the inverter, a second terminal for receiving a second power VDDQ and a second control terminal.

FIG. 7 is a timing diagram of a switch 40 of FIG. 5.

Referring to FIG. 7, the control signal iREF is enabled by a command CMD that indicates a refresh operation mode and is sustained until the refresh operation ends. It is possible that the switch 40 continuously performs the switching operation except a data read operation mode in which the power VDDQ is used. The switch 338 of the first related art can be used only in a limited short pulse width because the internal power of a memory array increases if two different powers having different voltage levels are connected to each other beside the short pulse width in the first related art.

As described above, the apparatus and method for applying power according to the embodiment can overcome the power supply problem of applying the VDD power to the array block and the peripheral logic block, which are disposed closely to data input/output pins, in a predetermined operation mode that requires a large amount of current such as the refresh mode in a semiconductor memory device such as a DDR3 SDRAM employing JEDEC standard.

In order to overcome the power supply problem, the apparatus according to the embodiment applies the VDDQ power, which is applied to a data output drier that is not driven in the operation mode, to the memory array block and the peripheral logic block. Therefore, it is possible to guarantee the stable operation of the memory array block and the peripheral logic block.

Embodiments of the invention relate to an apparatus and method for applying power to a semiconductor memory device. The apparatus and method according to the invention control the memory array block and the peripheral logic block to operate stably by applying a power VDDQ, which is applied to the data output driver that is not driven in a predetermined operation mode requiring a large amount of current, to the data output driver.

While the invention has been described with respect to the specific embodiments, it will be apparent to those skilled in the art that various changes and modifications may be made without departing from the spirit and scope of the invention as defined in the following claims.

Although the invention was described to be applied to a pin-out structure of a DDR3 SDRAM package employing JEDEC standard in the specification, the invention is not limited thereto. The invention may be identically applied to any other semiconductor memory device having a problem of VDD power supply to the memory array block and the peripheral logic block adjacent to the data input/output pin in a predetermined operation mode that requires a large amount of current instantly, such as a refresh mode.

Although the invention was described as applying powers VDD and VDDQ of 1.5±0.075[V] from the outside, the invention is not limited thereto. The invention can be applied identically if the powers VDD and VDDQ have the same voltage level.

Although the invention was described to have the switch embodied by FETs, the invention is not limited thereto. The invention can be applied identically to any switches that perform a switching operation in response to a control signal indicating an operation mode.

What is claimed is:

1. An apparatus for applying power to a semiconductor memory device, comprising:
    a first power pin for receiving a first power at a first voltage from an external device;
    a second power pin for receiving a second power at the first voltage from the external device;
    a memory array block connected to the first power pin, the memory array block configured to write input data in a data write operation, to output read data in a data read operation, and to undergo a refresh operation at regular intervals to sustain stored data;
    a peripheral logic block connected to the first power pin and configured to communicate with the memory array block to perform the data write operation and the data read operation;
    a data output driver connected to the second power pin and configured to drive a data output pin to output data from the memory array block through the peripheral logic block; and
    a switch to electrically connect the first power pin and the second power pin by performing a switching operation during the refresh operation.

2. The apparatus of claim 1, wherein the switch includes at least one field effect transistor for performing the switching operation in response to a control signal that determines the refresh operation.

3. The apparatus of claim 1, wherein the switch includes:
    an inverter configured to receive a control signal that determines the refresh operation, and to invert the control signal;
    a first field effect transistor including a first power receiving terminal configured to receive the second power, a first control terminal configured to receive and invert an output of the inverter, a second power receiving terminal configured to receive the first power, and a second control terminal; and a second field effect transistor including a first power receiving terminal configured to receive the first power, a first control terminal configured to receive and invert the output of the inverter, a second power receiving terminal configured to receive the second power, and a second control terminal.

4. The apparatus of claim 1, wherein the first power is applied to the memory array block and the peripheral logic block, and the second power drives the data output driver.

5. A method for applying power to a semiconductor memory device including a first power pin receiving a first power at a first voltage from the external device, a second power pin receiving a second power at the first voltage, a memory array block connected to the first power pin, the memory array block writing input data in a data write operation, outputting read data in a data read operation, and refreshing regularly to sustain stored data, a peripheral logic block connected to the first power pin communicating with the memory array block to perform the data write operation and the data read operation, a data output driver connected to the second power pin driving a data output pin to output data from the memory array block through the peripheral logic block, the method comprising:

determining whether a current operation mode is a refresh operation mode of the memory array block; and electrically connecting the first power pin with the second power pin in the refresh operation mode.

6. The method of claim 5, wherein the first power is applied to the memory array block and the peripheral logic block, and the second power drives the data output driver.

7. An apparatus for applying power to a semiconductor memory device, comprising:

a first power pin configured to receive a first power at a first voltage from an external device;

a second power pin configured to receive a second power at the first voltage from the external device;

a memory array block configured to write input data in a data write operation and to output read data in a data read operation;

a peripheral logic block configured to communicate with the memory array block to perform the data write operation and the data read operation;

a data output driver configured to drive a data output pin to output data from the memory array block through the peripheral logic block;

a first power bus connecting the memory array block and the peripheral logic block to the first power pin and configured to apply the first power to the memory array block and the peripheral logic block;

a second power bus connecting the data output driver to the second power pin and configured to apply the second power to the data output driver; and a switch configured to connect the first power bus and the second power bus by performing a switching operation in an operation mode where the data output driver is not driven and a voltage of a power applied to the first power bus is below the first voltage.

8. The apparatus of claim 7, wherein the operation mode is a refresh mode in which the memory array block is regularly refreshed to sustain data stored in the memory array block.

9. The apparatus of claim 8, wherein the switch includes at least one field effect transistor that performs a switching operation in response to a control signal determining the refresh mode.

10. The apparatus of claim 8, wherein the switch includes:

an inverter configured to receive and invert a control signal determining the refresh mode and to output an inverted control signal;

a first field effect transistor including a first power receiving terminal to receive the second power, a first control terminal to receive and invert an output of the inverter, a second power receiving terminal to receive the first power, and a second control terminal; and a second field effect transistor including a first power receiving terminal to receive the first power, a first control terminal to receive and invert the output of the inverter, a second power receiving terminal to receive the second power, and a second control terminal.

11. The apparatus of claim 7, wherein the first power is applied to the memory array block and the peripheral logic block, and the second power drives the data output driver.

12. A method for applying a power to a semiconductor device including a first power pin receiving a first power at a first voltage from an external device, a second power pin receiving a second power at the first voltage, a memory array block writing input data and outputting read data, a peripheral logic block for communicating with the memory array block to perform a data write operation and a data read operation, a data output driver driving a data output pin and outputting data from the memory array block through the peripheral logic block, a first power bus connecting the memory array block and the peripheral logic block to the first power pin and applying the first power to the memory array block and the peripheral logic block, and a second power bus connecting the data output driver to the second power pin and applying the second power to the data output driver, the method comprising:

determining whether a voltage level of a power applied to the first power bus is below the first voltage and whether a current operation mode is an operation mode where the data output driver is not driven; and electrically connecting the first power bus and the second power bus if the current operation mode is the operation mode where the data output driver is not driven.

13. The method of claim 12, wherein the operation mode is a refresh mode in which the memory array block is refreshed regularly, sustaining data stored in the memory array block.

14. The method of claim 12, wherein the first power is applied to the memory array block and the peripheral logic block, and the second power drives the data output driver.

* * * * *